United States Patent [19]
Dahnert

[11] Patent Number: 5,121,975
[45] Date of Patent: Jun. 16, 1992

[54] FAIL-SAFE PHOTOELECTRIC DETECTOR

[75] Inventor: Dean L. Dahnert, Fort Atkinson, Wis.

[73] Assignee: Spacesaver Corporation, Fort Atkinson, Wis.

[21] Appl. No.: 697,307

[22] Filed: May 8, 1991

[51] Int. Cl.$^5$ ............................................. A47B 88/00
[52] U.S. Cl. .................................................... 312/201
[58] Field of Search .................... 324/158 R, 527; 312/198, 201

[56] References Cited

U.S. PATENT DOCUMENTS

| | | | |
|---|---|---|---|
| 2,851,660 | 9/1958 | Tobin et al. | 324/527 |
| 4,259,592 | 7/1988 | Dahnert | 312/201 |
| 4,745,516 | 5/1988 | Griffin | 312/201 X |

*Primary Examiner*—Joseph Falk
*Attorney, Agent, or Firm*—Fuller, Ryan, Hohenfeldt & Kees

[57] ABSTRACT

A control circuit for continually testing a photoelectric detector. The detector includes a light source, and a photoelectric receiver having a predetermined drop-out time, attached to a movable storage carriage, spaced apart and substantially sightaligned. The carriage has a reversible electric motor which is controlled by the control circuit, including at least two relays, the contacts of which are connected in series so that the contacts of both must be closed in order for the motor to be energized. The relay drop-out time is substantially longer than the receiver drop-out time. In the circuit, an inverter is connected between the second coil and the light source. This inverter inverts signals received from the second coil and passes them to the light source so that receipt of a signal at the receiver causes the light source to turn off, in turn causing a loss of signal at the receiver, resulting in the light source turning on. An oscillation is thus established which passses through each component of the monitoring circuit and the detector. The drop-out time of the relays is long enough that the relays stay closed unless the oscillation is stopped, either by a failure of the monitoring circuit or light source or receiver, or by the light beam being broken. In either case, one or both of the relays opens, disabling the carriage from moving.

16 Claims, 2 Drawing Sheets

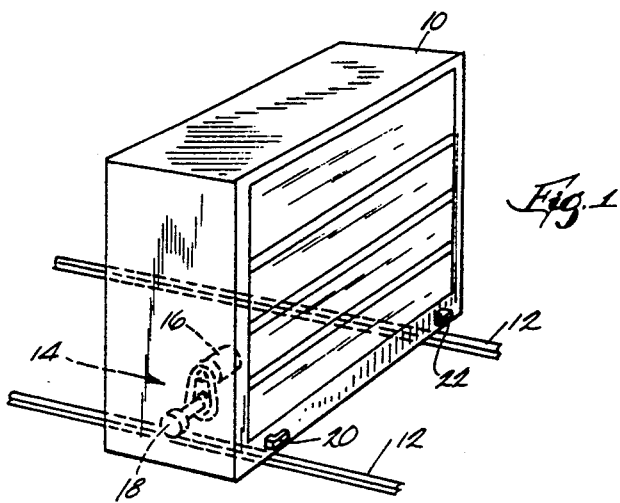
Fig. 1
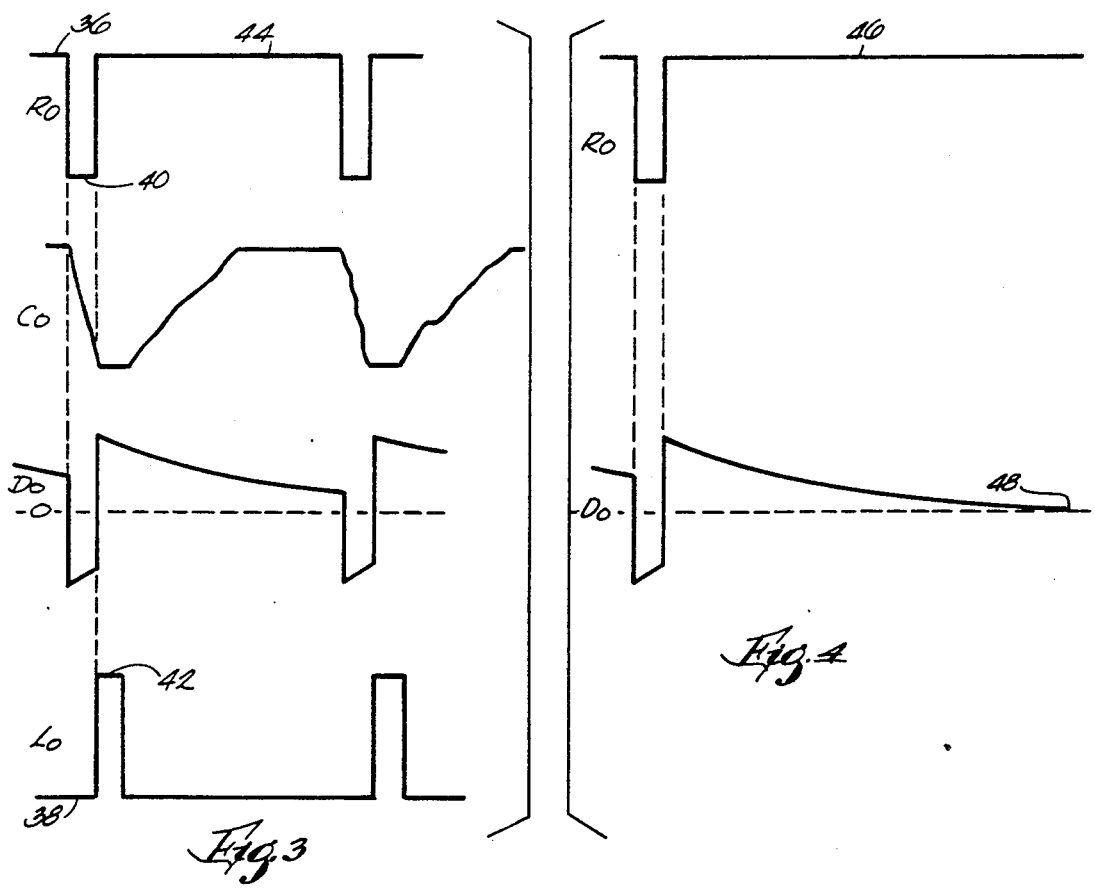
Fig. 3
Fig. 4

FAIL-SAFE PHOTOELECTRIC DETECTOR

BACKGROUND OF THE INVENTION

This invention relates to photoelectric detector circuits and controls for those circuits, and in particular to those circuits as applied to movable storage units to disable the movement of those units if there is something in the way.

Movable storage units are of course well known, as indicated in many U.S. Patents such as Dahnert, U.S. Pat. No. 4,557,534. As described in that patent, some examples of movable storage units are library bookshelves, file cabinets, film storage files and racks used in warehouses and industry to store parts and finished and unfinished goods. Most commonly the storage units are mounted on wheeled carriages which run on rails. Each carriage normally has at least one prime mover such as a reversible electric motor for propelling it along the rails. In order to avoid damaging an object or injuring a person in the way of the moving carriage, it has been conventional to provide the carriage with a sweep bar that sweeps along the floor preceding the moving carriage to actuate a safety switch when the bar contacts the object so as to arrest the movement of the carriage. Depending upon the nature of the object, however, contact between the object and the sweep bar can damage the sweep bar. In addition, the sweep bar can be subject to damage from other sources. For instance, if the storage units are used in an industrial application, there is potential for damage from material handling equipment such as lift trucks.

One alternative to a mechanical sweep is the use of a photoelectric detector device, to detect the existence of an obstructing object in the path of the moving carriage and then disable the movement of the carriage. The problem here is that, since the application is critical, involving as it does the personal safety of users of the movable storage units, the detection system must be made fail-safe.

This invention relates to improvements to the apparatus described above and to solutions to the problems raised thereby.

SUMMARY OF THE INVENTION

A mobile storage system has at least one movable storage carriage mounted to a rail or set of rails, and likely several such movable units on each set of rails. There may also be stationary units at each end of the rails. A light source and a photoelectric receiver are attached to each movable storage carriage, spaced apart and substantially sightaligned. Generally the light source would be attached at one end of the carriage and the receiver at the other end. This receiver is of the type that has a predetermined drop-in time and a predetermined dropout time, and for this application the receiver dropin time is to be substantially shorter than the dropout time. As indicated above, moving means are provided for moving the storage carriage, including a prime mover such as a reversible electric motor. A control circuit which controls the motor to place the moving means in either an on condition or an off condition. Generally such a control circuit would include at least two switches, such as relays. Each such switch has conducting means, such as switch contacts, capable of assuming conducting and non-conducting conditions, and controlling means such as a relay coil for controlling the condition of the conducting means. These switches have a predetermined switch drop-out time, this switch drop-out time being substantially longer than the receiver drop-out time. The contacts of the switches are connected in series so that the contacts of both must be closed in order for the motor to be energized.

The invention relates to a circuit for monitoring the operation of the light source and photoelectric receiver, wherein the controlling means or coil of the first switch is connected to receive a signal from the photoelectric receiver, signal conditioning means are connected between the coil of the first switch and the controlling means or coil of the second switch, and inverting means are connected between the coil of the second switch and the light source. This inverter inverts signals received from the coil of the second switch and passes them to the light source for controlling whether the light source is energized. That is, receipt of a signal at the receiver causes the light source to turn off, which in turn causes a loss of signal at the receiver, causing the light source to turn on. An oscillation is thus begun wherein which is participated in by each component of the monitoring circuit and the light source and receiver. The drop-out time of the relays is long enough, though, that the relays stay closed unless the oscillation is stopped, either by a failure of the monitoring circuit or light source or receiver, or by the light beam being broken by an obstruction in the path of the moving storage carriage. In either case, one or both of the relays opens, disabling the movement of the carriage.

The signal conditioning means includes means for squaring the signal received from the coil of the first switch, such as a Schmitt trigger. The signal conditioning means also includes means for differentiating the signal from the squaring means prior to sending it on to the coil of the second switch. That is, the conditioning means provides AC coupling, preventing the long term passage of steady-state signals, and permitting only transients to pass.

Other objects and advantages of the invention will become hereinafter.

DESCRIPTION OF THE DRAWING

FIG. 1 is a perspective view of a mobile storage unit including a photoelectric detector arrangement according to a preferred embodiment of the invention.

FIG. 3 is a graphical representation of certain waveforms generated at various points during operation of the circuit shown in FIG. 2 with the light beam unbroken.

FIG. 4 is a graphical comparison of certain waveforms generated when a component of the circuit shown in FIG. 2 has failed or when the light beam is broken by an obstruction.

DESCRIPTION OF THE PREFERRED EMBODIMENT

Figure 2:
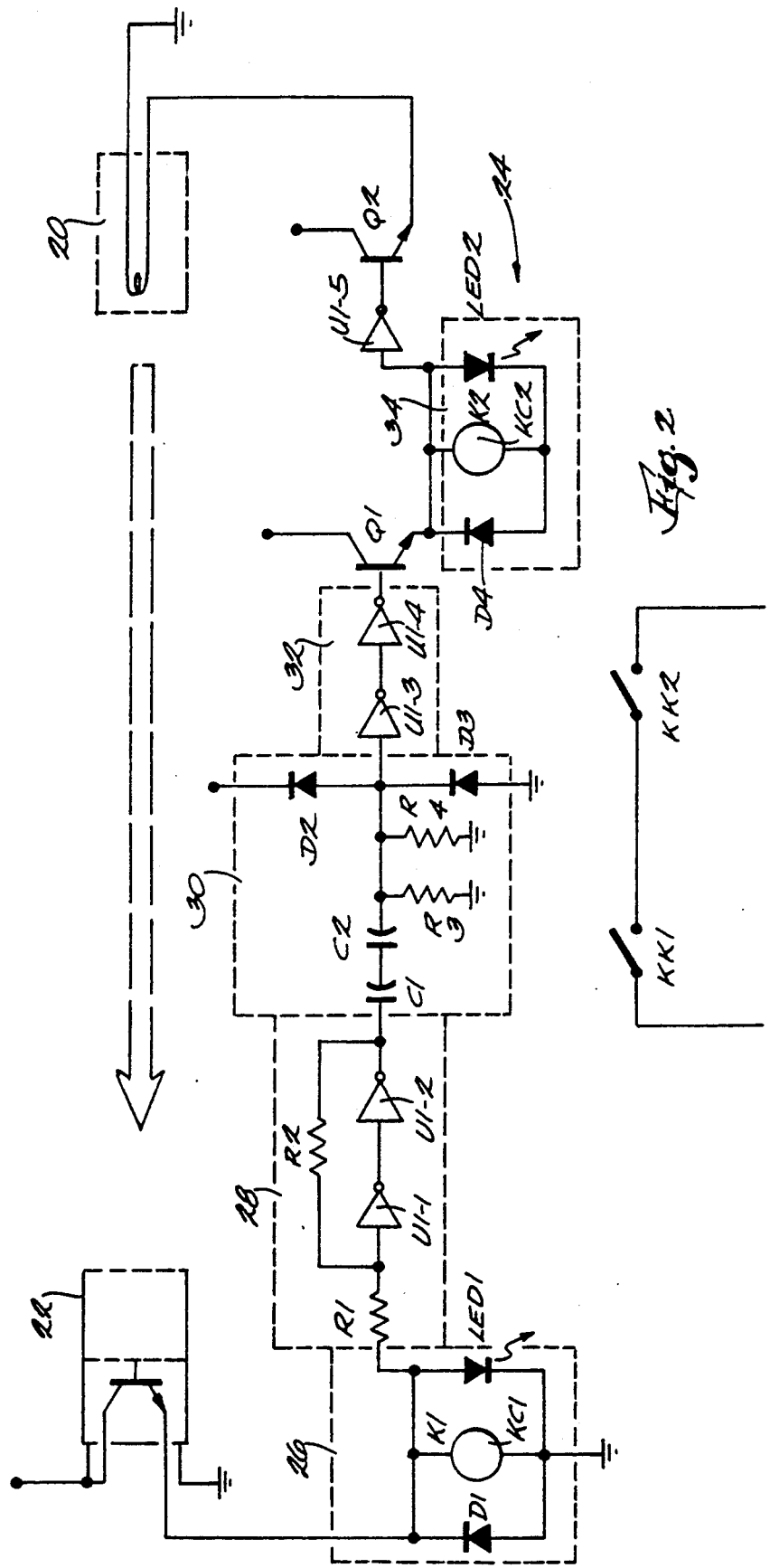
FIG. 2 is a schematic view of a fail-safe circuit constructed according to a preferred embodiment of the invention.

Referring now to FIG. 1, there is shown a storage unit 10 mounted to and movable along at least one and likely several rails 12. The storage unit 10 by means of a prime mover 14 such as a reversible electric motor 16 driving a drive wheel 18. In commercial embodiments there will likely be several such movable units 10 on each set of rails. There may also be stationary units (not shown) at one or both ends of the rails.

According to the invention, a light source 20 and a photoelectric receiver 22 are attached to each movable storage unit 10, spaced apart and substantially sight-aligned. That is, the light source 20 and receiver 22 are aligned so that the light source projects light into the receiver except when there is some object not a part of the unit 10 positioned between the light source and receiver. Generally, as shown in FIG. 1, the light source 20 would be attached at one end of the unit 10, near the bottom, and the receiver 22 at the other end. The light source 20 may be any suitable light source compatible with the receiver 22, including infrared and light emitting diode. One model that has been found to work well is the Allen-Bradley Photoswitch Model 42SRL-6000 for the light source 20 and Model 42SRR-6002 for the receiver 22, although the invention is not by any means intended to be limited to these models.

The light source 20 and photoelectric receiver 22 are connected to control the operation of the prime mover 14 by a control circuit 24 which is the subject of the invention, shown in FIG. 2. As there shown, the control circuit 24 controls two switches K1 and K2. While in the drawing figure the switches K1 and K2 are shown as relays, with contacts KK1 and KK2 respectively, and coils KC1 and KC2 respectively, other suitable switches having corresponding conducting means and means for controlling those conducting means could be substituted.

As shown in FIG. 2, contacts KK1 and KK2 of the switches K1 and K2 respectively are connected in series, so that both sets of contacts must be closed for the circuit containing them to be conductive. These contacts KK1 and KK2 are connected in the normal control loop for controlling the motor 16 which moves the storage unit 10, such as disclosed in Griffin, U.S. Pat. No. 4,745,516, the disclosure of which is incorporated herein by reference in its entirety Hence both KK1 and KK2 must be closed for the motor 16 to move the storage unit 10.

As can be seen in FIG. 2, according to the invention the receiver 22 has an output that is connected to a first switch circuit 26, which includes the coil KC1 of the relay K1. First switch circuit 26 also includes a diode D1 connected across the coil KC1 to suppress the inductive voltage of the relay K1, and a light emitting diode LED1 to indicate when the relay is energized. Hence the relay contacts KK1 are closed whenever the receiver 22 is receiving a light signal from the light source 20.

The signal from the receiver 22 then passes to a Schmitt trigger circuit 28. This Schmitt trigger circuit 28 includes a pair of inverters U1-1 and U1-2 connected together serially to act as a buffer, together with an input resistor R1 and a feedback resistor R2. The Schmitt trigger circuit 28 provides a signal to the rest of the circuit 24 with clean edges. Hence after this circuit 28 the signal has the same duty cycle and polarity as it did at relay K1.

From there the signal is passed to a differentiator circuit 30, including capacitors C1 and C2, resistors R3 and R4, and diodes D2 and D3. This differentiator circuit 30 ensures that the oscillation designed into the circuit 24, to be explained presently, is critical to the continued operation of the circuit.

The signal is then buffered by a buffer circuit 32, including two series inverters U1-3 and U1-4. This buffer circuit 32 drives a drive transistor Q1. In turn transistor Q1 drives a second switch circuit 34 in much the same way the receiver 22 drives the first switch circuit 26. The second switch circuit is identical to first switch circuit 26, including a diode D4 connected across the coil to suppress the inductive voltage of the relay, and a light emitting diode LED2 to indicate when the relay is energized. From the second switch circuit 34, the signal is sent to an inverter U1-5, which inverts the signal and drives a driver transistor Q2, which in turn drives the light source 20 with a signal basically inverted from that received from the receiver 22.

Referring now to FIGS. 3 and 4, there are shown graphical representations of several waveforms useful in explaining the operation of the circuit 24. In FIG. 3, $R_0$ is the waveform of the receiver output signal, $L_0$ is the waveform of the light source output signal, $C_0$ is the waveform of output of the relay coil KC1 and $D_0$ is the waveform of the output of the differentiator 30. First, then, when the circuit 24 is initially energized, the light source 20 is energized in a steady state ON mode. This results in the receiver 22 outputting a steady high or ON signal, as shown at 36. This ON signal travels through the circuit 24 basically intact, until it arrives at inverter U1-5, where it is inverted to a steady OFF state, thereby turning the light source 20 off, as shown at 38. Since light source 20 is off, the receiver 22 is not receiving a signal, and its output switches to OFF after the receiver drop-out time, as shown at 40, until this OFF signal again reaches the inverter U1-5, where it is again inverted and turns the light source ON, as shown at 42, again energizing the receiver 22 as shown at 44. Thus an oscillation is set up, wherein every active device in the circuit is continuously exercised between an OFF state and an ON state.

The values of the devices are chosen so that the switch circuits 26 and 34 do not drop out during the normal oscillation. That is, the drop-out time for the receiver 22 is chosen, and the other components are selected, so that the drop-out time of the receiver is much less than the drop-out time of the relays K1. As shown in FIG. 3, the components are chosen so that the receiver is ON about 95% of the time and OFF about 5% of the time. Conversely, then, the light source will be ON about 5% of the time and OFF about 95% of the time. The operation of the circuit assumes that the drop-out time of the receiver 22 is sufficiently long that it will be satisfied by that 5% ON time from the light source 20.

Thus if the oscillation of the circuit is about 100 cycles per second, for example, the signal to the relay coils KC1 and KC2 would only be OFF for about 0.5 msec. per cycle. Since the drop-out time for common relays is often 15 to 20 msec., the relays easily hold the contacts KK1 and KK2 closed during the normal oscillation of the circuit. Clearly, however, if there is an obstruction of the light signal between the light source 20 and the receiver 22, or if a component of the circuit fails so that the oscillation is not maintained, the relay contacts will open, disabling the motor 16 from moving the storage unit 10.

As indicated above, the Schmitt trigger circuit 28 provides a signal to the rest of the circuit 24 with clean edges. $C_0$ is the waveform of output of the relay coil KC1 and will often be somewhat uneven as shown in FIG. 3. After the Schmitt trigger circuit 28, the signal again basically assumes the appearance of $R_0$.

Also as indicated above, the differentiator circuit 30 ensures that the oscillation designed into the circuit 24 is critical to the continued operation of the circuit. That is, it provides AC coupling, so that the output of the differentiator 30 has the appearance of the $D_0$ waveform, preventing the long term passage of steady-state signals, and permitting only transients to pass. That way if the receiver 22 fails in such a way as to maintain a steady ON signal to the coil KC1, as shown in FIG. 4 at 46, the signal $D_0$ from the differentiator 30 to the coil KC2 decays over time to zero, as shown at 48, and KC2 opens, maintaining the fail-safe characteristic of the circuit While the apparatus hereinbefore described is effectively adapted to fulfill the aforesaid objects, it is to be understood that the invention is not intended to be limited to the specific preferred embodiment of fail-safe photoelectric detector set forth above. Rather, it is to be taken as including all reasonable equivalents within the scope of the following claims.

I claim:

1. A fail-safe circuit for continuously testing a photoelectric detector arrangement, said detector having a light source and a photoelectric receiver, said circuit comprising:

at least a first switch and a second switch, each said switch having conducting means capable of assuming conducting and non-conducting conditions, and means for controlling said conducting means, the controlling means of said first switch connected to receive a signal from said photoelectric receiver;

signal conditioning means connected between said controlling means of said first switch and the controlling means of said second switch, for AC coupling said two controlling means; and inverting means connected between said controlling means of said second switch and said light source, such that signals received from said controlling means of said second switch are inverted and passed to said light source.

2. A fail-safe circuit as recited in claim 1 wherein said signal conditioning means includes means for squaring the signal received from said controlling means of said first switch.

3. A fail-safe circuit as recited in claim 2 wherein said squaring means includes a Schmitt trigger.

4. A fail-safe circuit as recited in claim 3 wherein said signal conditioning means includes means for differentiating the signal from said squaring means.

5. A photoelectric detector arrangement comprising:
   a light source;
   a photoelectric receiver substantially sight-aligned with said light source, said receiver having a predetermined drop-in time and a predetermined drop-out time, said receiver drop-in time being substantially shorter than said receiver drop-out time; and
   a circuit for testing the detector arrangement, said testing circuit including:
      at least a first switch and a second switch, each said switch having conducting means capable of assuming conducting and non-conducting conditions, and means for controlling said conducting means, the controlling means of said first switch connected to receive a signal from said photoelectric receiver, and each switch having a predetermined switch drop-out time, each said switch drop-out time being substantially longer than said receiver drop-out time;

signal conditioning means connected between said controlling means of said first switch and the controlling means of said second switch, for preventing long-term passage of steady-state signals between said two controlling means; and
      inverting means connected between said controlling means of said second switch and said light source, such that signals received from said controlling means of said second switch are inverted and passed to said light source for controlling whether said light source is energized.

6. A photoelectric detector arrangement as recited in claim 5 wherein said signal conditioning means includes means for squaring the signal received from said controlling means of said first switch.

7. A photoelectric detector arrangement as recited in claim 6 wherein said squaring means includes a Schmitt trigger.

8. A photoelectric detector arrangement as recited in claim 7 wherein said signal conditioning means includes means for differentiating the signal from said squaring means.

9. A mobile storage system comprising:
   a. at least one movable storage carriage;
   b. a light source attached to said storage carriage;
   c. a photoelectric receiver attached to said storage carriage, spaced apart from said light source and substantially sight-aligned with said light source, said receiver having a predetermined drop-in time and a predetermined drop-out time, said receiver drop-in time being substantially shorter than said receiver drop-out time;
   d. moving means for moving said storage carriage, said moving means including:
      1) a prime mover;
      2) a control circuit for controlling said prime mover to place said moving means in an on condition and an off condition, including at least a first switch and a second switch, each said switch having:
         a) conducting means capable of assuming conducting and non-conducting conditions;
         b) controlling means for controlling the condition of said conducting means; and
         c) a predetermined switch dropout out time, each said switch drop-out time being substantially longer than said receiver drop-out time; and
   e. a circuit for monitoring the operation of the light source and photoelectric receiver, wherein:
      1) the controlling means of said first switch is connected to receive a signal from said photoelectric receiver;
      2) signal conditioning means are connected between said controlling means of said first switch and the controlling means of said second switch, for permitting only transients to pass therebetween; and
      3) inverting means are connected between said controlling means of said second switch and said light source, such that signals received from said controlling means of said second switch are inverted and passed to said light source for controlling whether said light source is energized.

10. A mobile storage system as recited in claim 9 wherein said signal conditioning means includes means for squaring the signal received from said controlling means of said first switch.

11. A mobile storage system as recited in claim 10 wherein said squaring means includes a Schmitt trigger.

12. A mobile storage system as recited in claim 11 wherein said signal conditioning means includes means for differentiating the signal from said squaring means.

13. A fail-safe circuit for controlling a pair of switches connected in series, said switches including conducting means capable of assuming conducting and non-conducting conditions, controlling means for controlling the condition of said conducting means, and a predetermined switch drop-out time, said fail-safe circuit comprising:

a light source;

a photoelectric receiver substantially sight-aligned with said light source, said receiver having a predetermined drop-in time and a predetermined drop-out time, said receiver drop-in time being substantially shorter than said receiver drop-out time, and said receiver drop-out time being substantially shorter than said switch drop-out time;

signal conditioning means connected between said controlling means of one of said switches and the controlling means of the other of said switches to provide AC coupling; and inverting means connected between said controlling means of said other of said switches and said light source, such that signals received from said controlling means of said other of said switches are inverted and passed to said light source;

the controlling means of said one of said switches being connected to receive a signal from said photoelectric receiver.

14. A fail-safe circuit as recited in claim 13 wherein said signal conditioning means includes means for squaring the signal received from said controlling means of said first switch.

15. A fail-safe circuit as recited in claim 14 wherein said squaring means includes a Schmitt trigger.

16. A fail-safe circuit as recited in claim 15 wherein said signal conditioning means includes means for differentiating the signal from said squaring means.

* * * * *